(12) United States Patent
Kang et al.

(10) Patent No.: US 11,477,898 B2
(45) Date of Patent: Oct. 18, 2022

(54) DISPLAY DEVICE

(71) Applicant: LG ELECTRONICS INC., Seoul (KR)

(72) Inventors: Seunggyu Kang, Seoul (KR); Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/275,541

(22) PCT Filed: Jul. 29, 2019

(86) PCT No.: PCT/KR2019/009389
§ 371 (c)(1),
(2) Date: Mar. 11, 2021

(87) PCT Pub. No.: WO2020/196996
PCT Pub. Date: Oct. 1, 2020

(65) Prior Publication Data
US 2022/0039275 A1 Feb. 3, 2022

(30) Foreign Application Priority Data
Mar. 28, 2019 (KR) .................. 10-2019-0035907

(51) Int. Cl.
*H05K 7/02* (2006.01)
*H05K 7/04* (2006.01)
(Continued)

(52) U.S. Cl.
CPC ......... *H05K 5/0217* (2013.01); *H05K 5/0017* (2013.01); *H05K 5/0247* (2013.01)

(58) Field of Classification Search
USPC ........................................ 361/807, 809, 810
See application file for complete search history.

(56) References Cited

U.S. PATENT DOCUMENTS 8,441,782 B2 * 5/2013 Thomas ................ E05C 19/166
361/679.02
8,662,605 B2 * 3/2014 McRorie ................ A61B 50/13
108/50.01
(Continued)

FOREIGN PATENT DOCUMENTS

| JP | 06-078250 | 3/1994 |
| KR | 20-0187964 | 7/2000 |

(Continued)

OTHER PUBLICATIONS

PCT International Application No. PCT/KR2019/009389, International Search Report dated Dec. 27, 2019, 4 pages.

*Primary Examiner* — Hung S. Bui
(74) *Attorney, Agent, or Firm* — Lee Hong Degerman Kang Waimey

(57) ABSTRACT

A display device is disclosed. An embodiment of the present invention may provide a display device comprising: a display panel; a module cover which is positioned at the rear of the display panel and to which the display panel is coupled; a frame which is positioned at the rear of the module cover and to which the module cover is coupled; a housing which is positioned below the module cover and is fixed to the frame; and a front cover which covers or opens the display panel and the housing while moving up and down on the frame, wherein the housing comprises: a base fixed inside the housing; and a cabinet which pivots about one side of the base and has a receiving space.

10 Claims, 17 Drawing Sheets

(51) Int. Cl.
*H05K 5/02* (2006.01)
*H05K 5/00* (2006.01)

(56) References Cited

U.S. PATENT DOCUMENTS

| | | | |
|---|---|---|---|
| 2007/0159035 A1* | 7/2007 | Mullen | A47B 46/005 |
| | | | 312/245 |
| 2011/0235249 A1* | 9/2011 | Bustle | G06F 1/182 |
| | | | 361/679.01 |
| 2014/0368096 A1 | 12/2014 | Pachmayr | |

FOREIGN PATENT DOCUMENTS

| KR | 10-0625777 | 9/2006 |
|---|---|---|
| KR | 10-2007-0077657 | 7/2007 |

* cited by examiner

[FIG. 1]
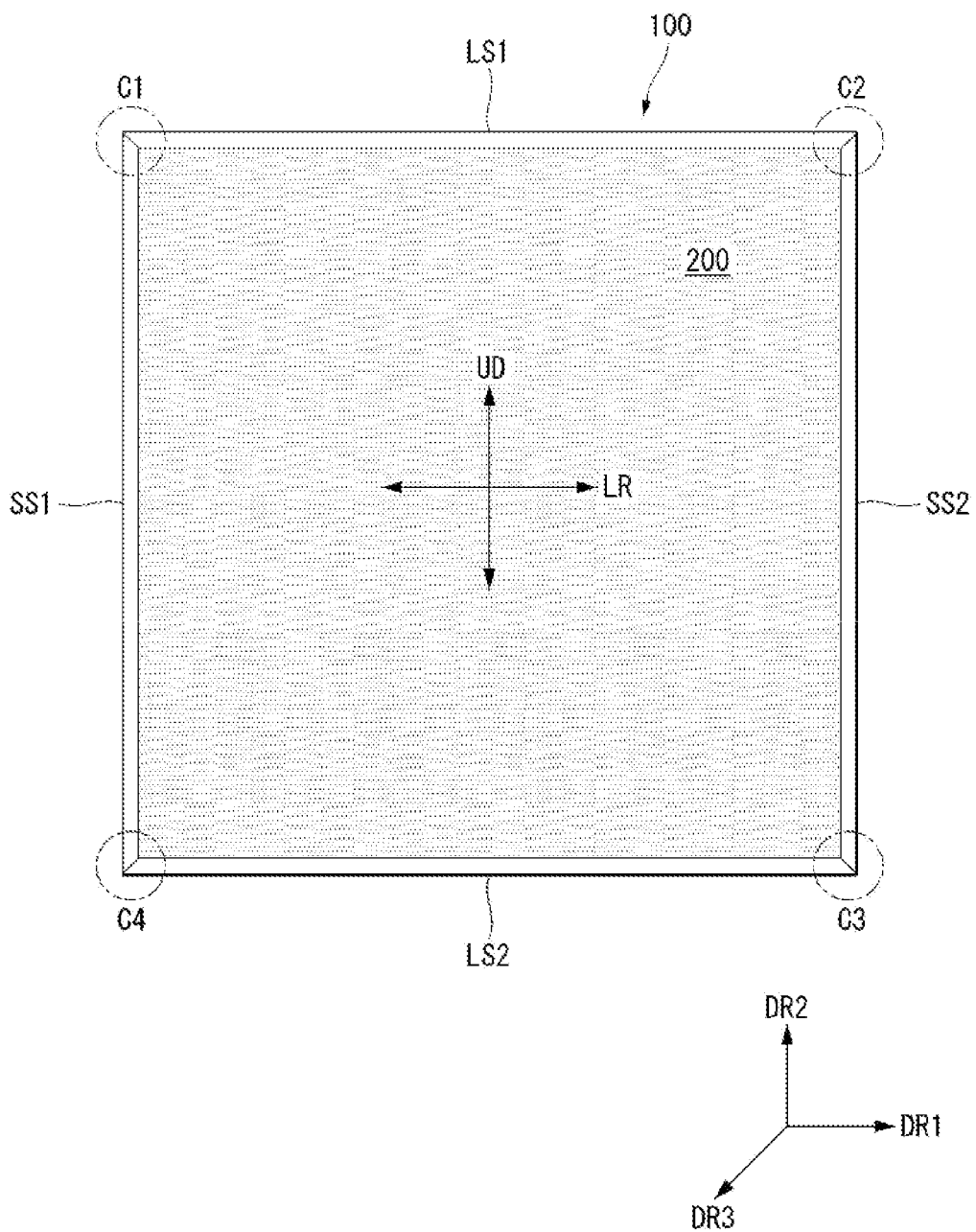

[FIG. 2]
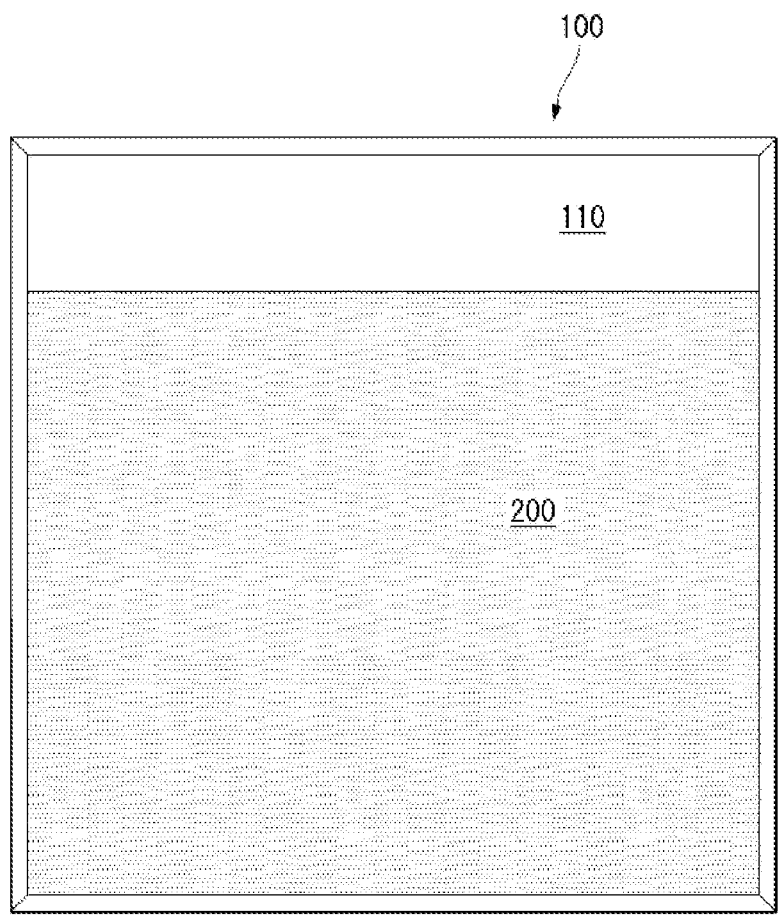

【FIG. 3】
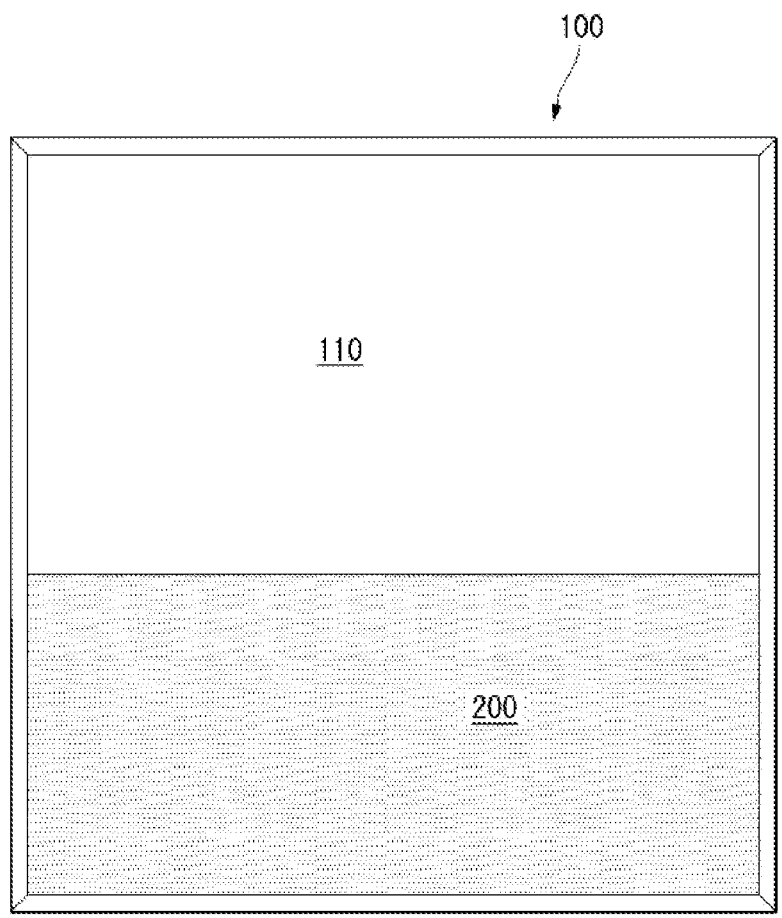

[FIG. 4]
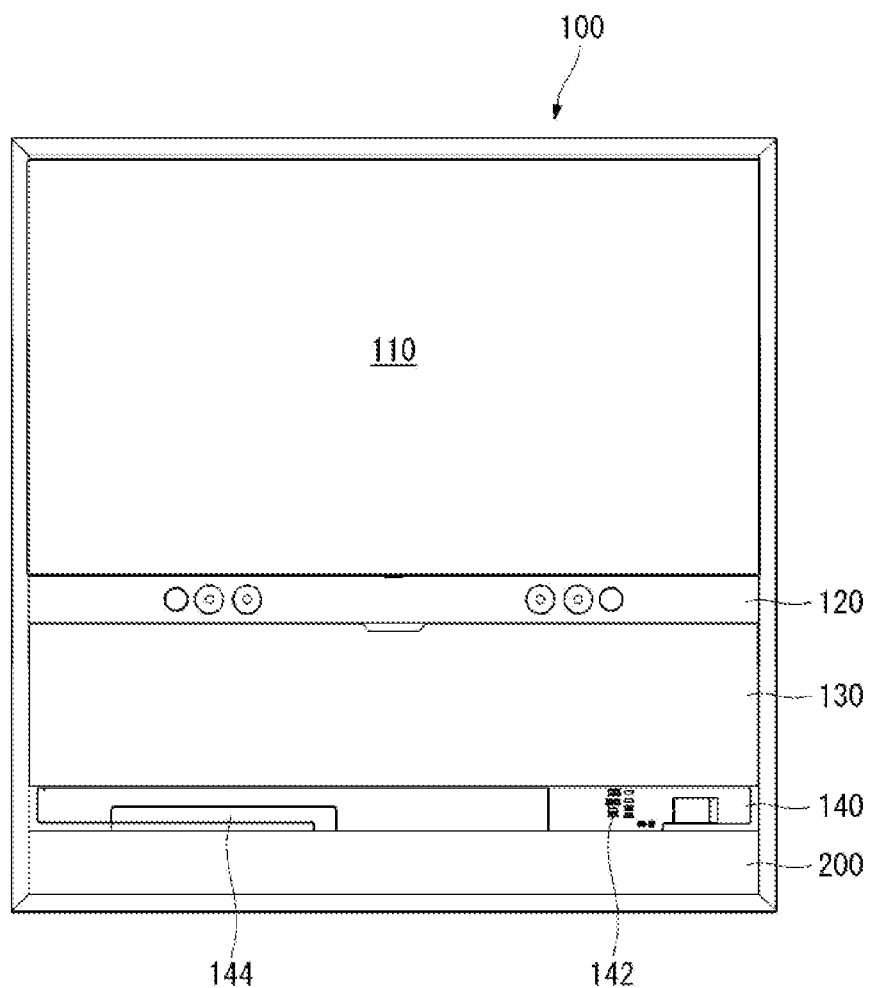

[FIG. 5]
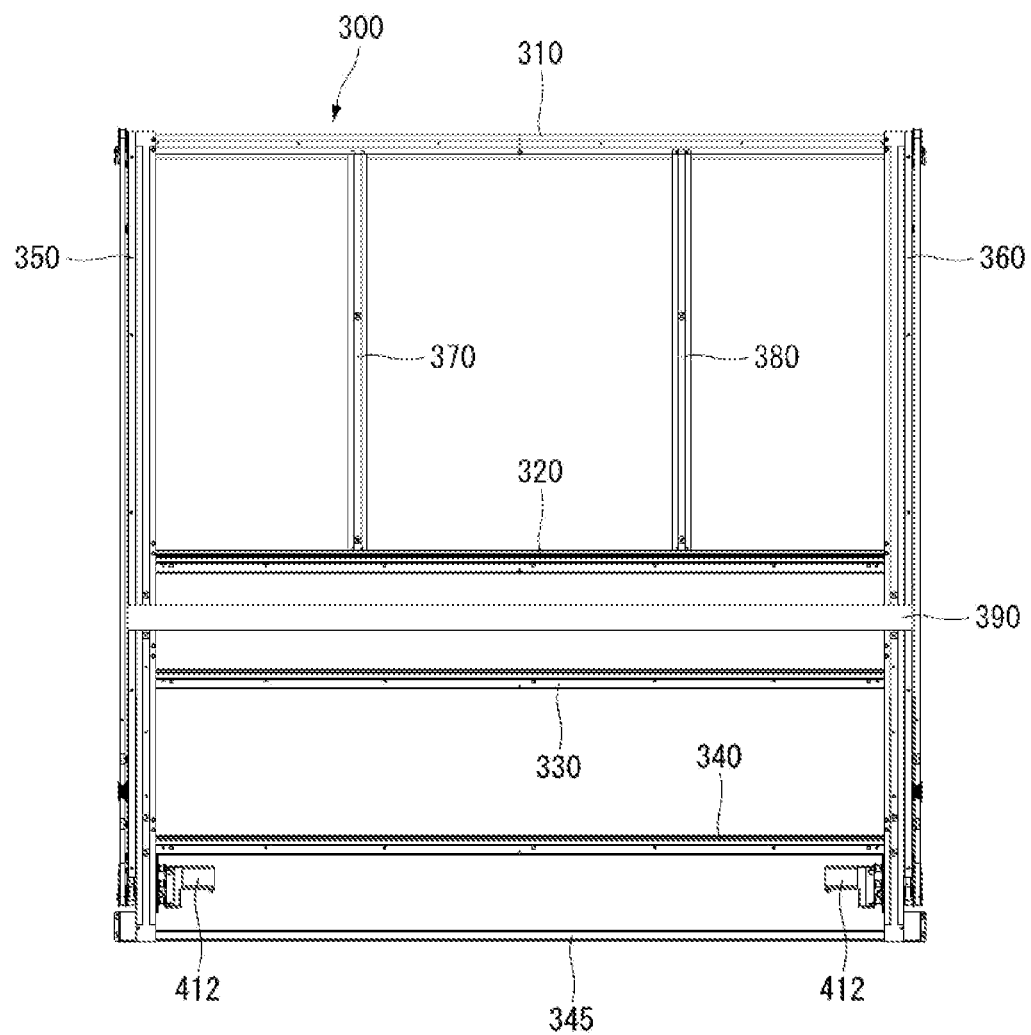

[FIG. 6]
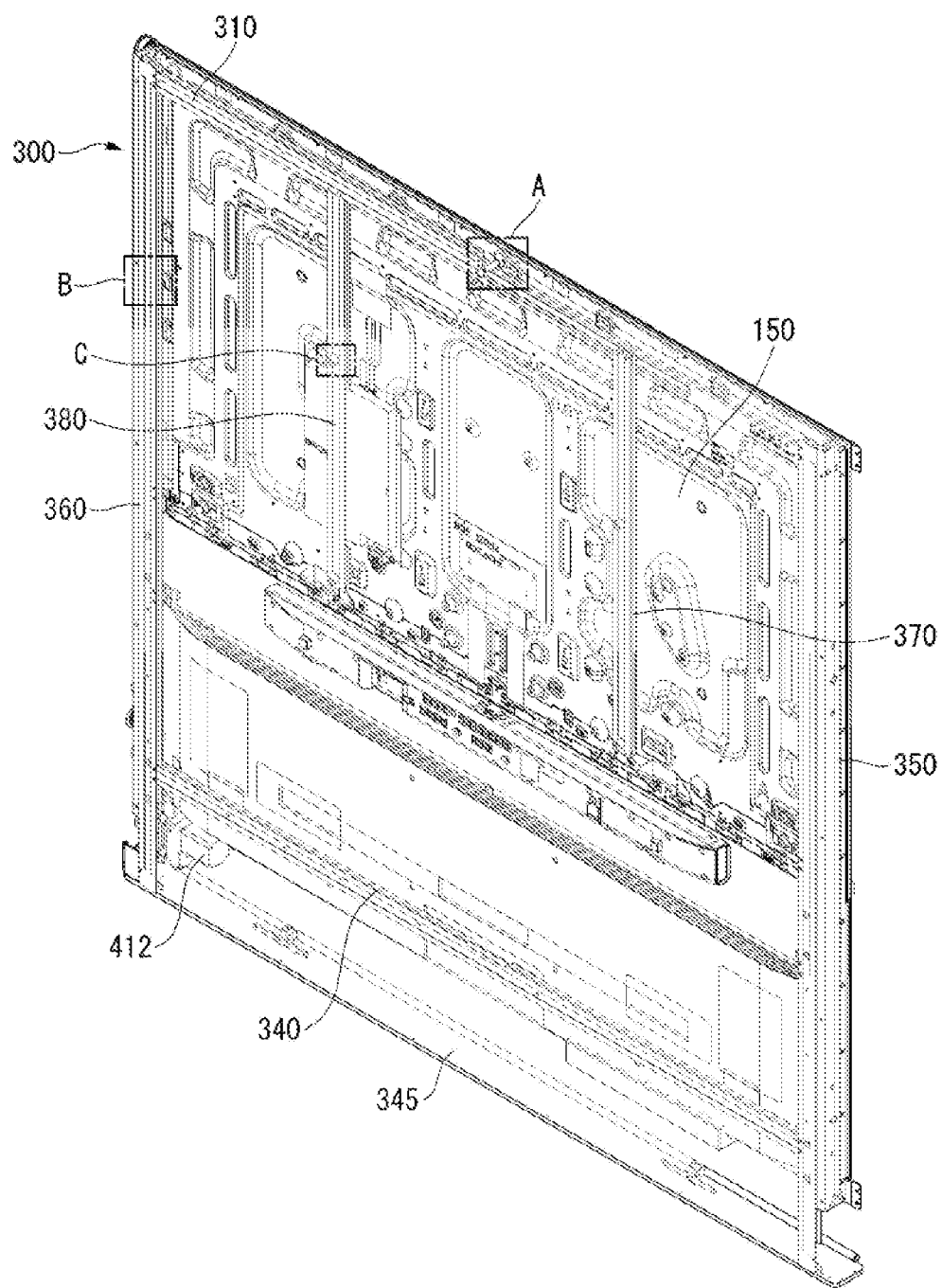

[FIG. 7]
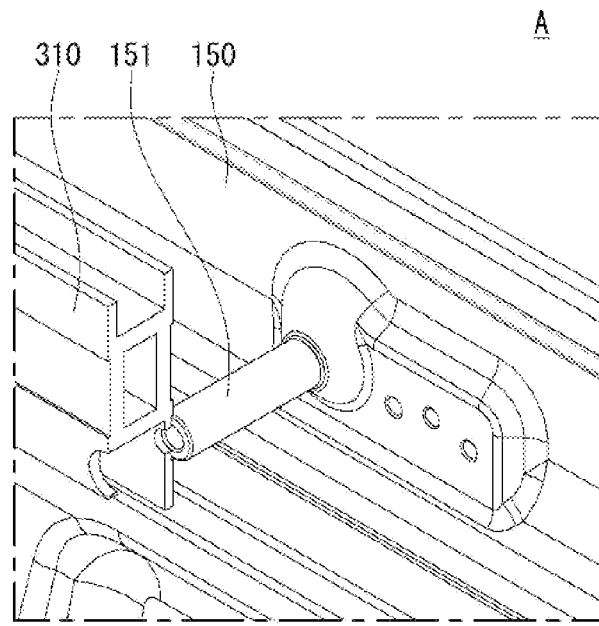
[FIG. 8]
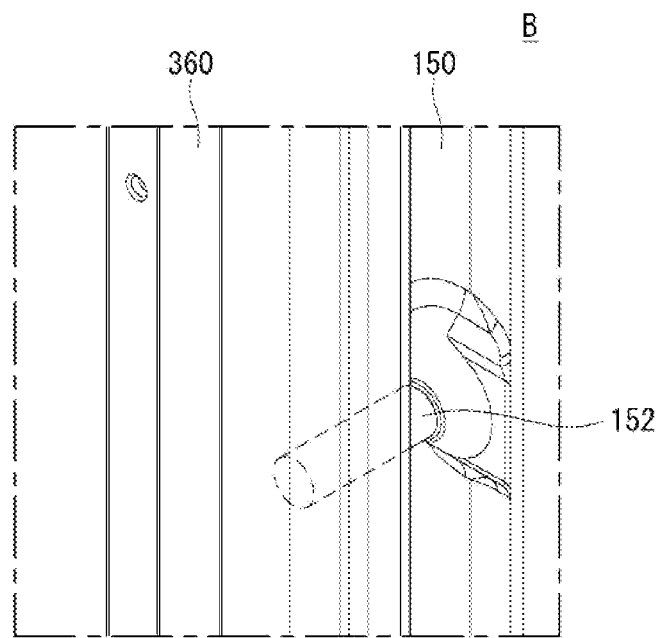

[FIG. 9]
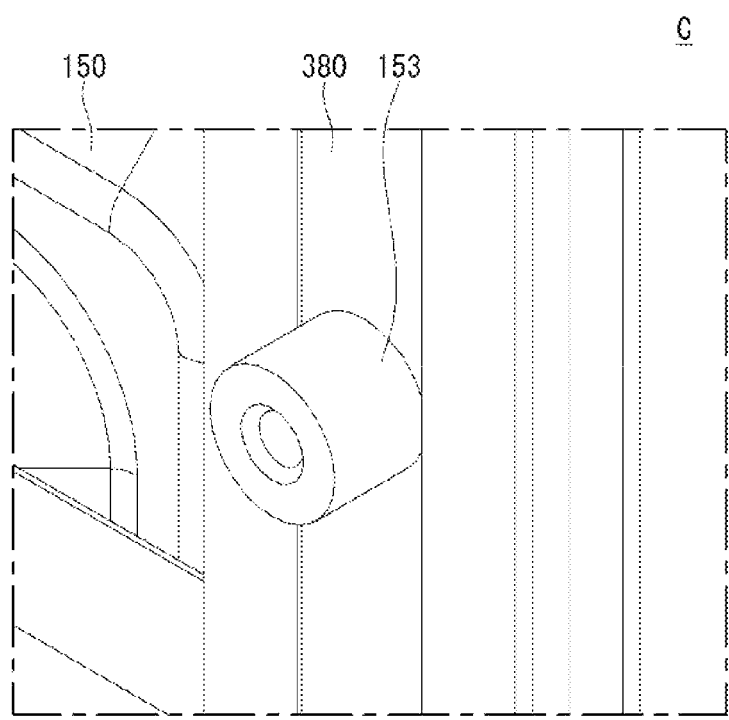

[FIG. 10]
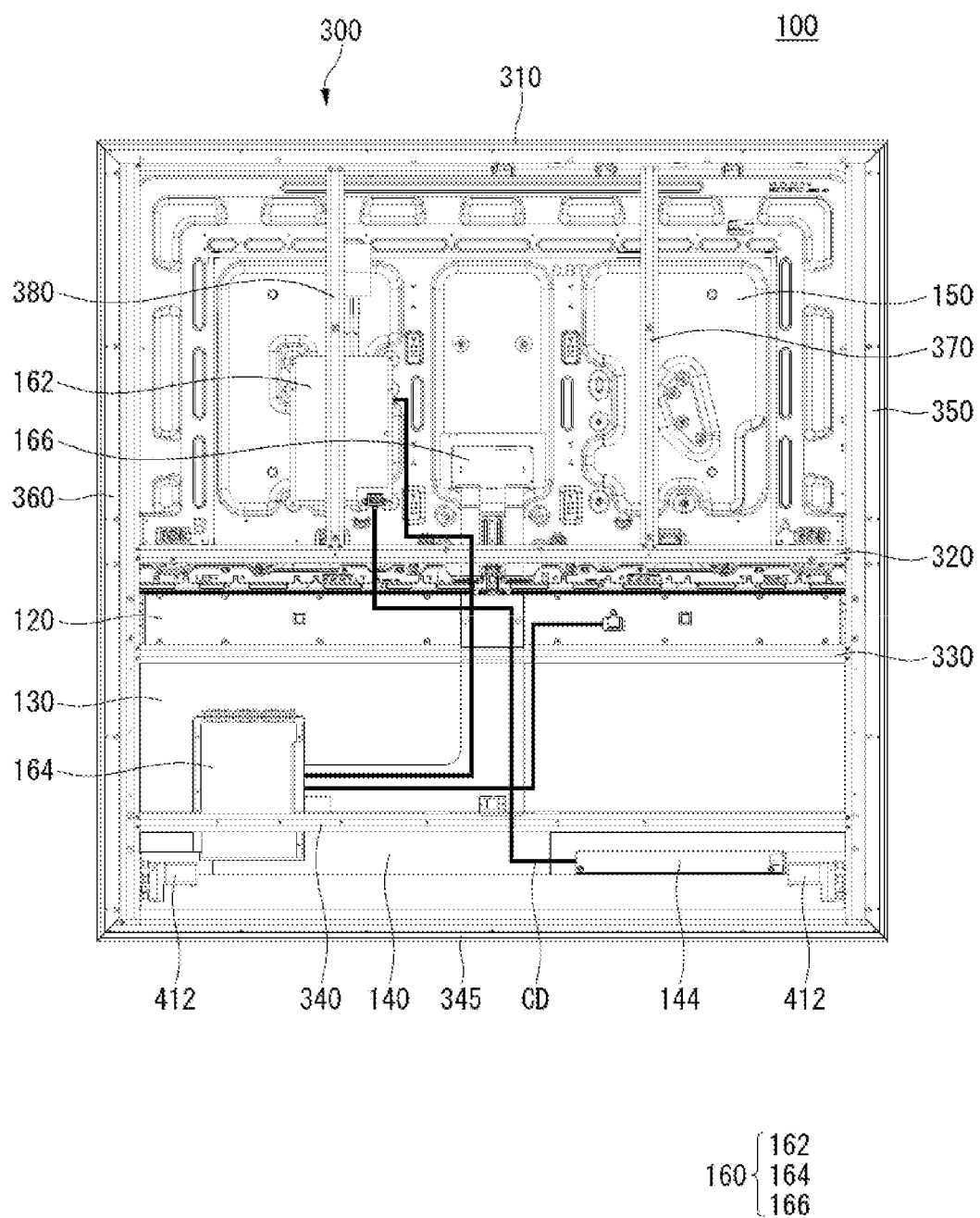

【FIG. 11】
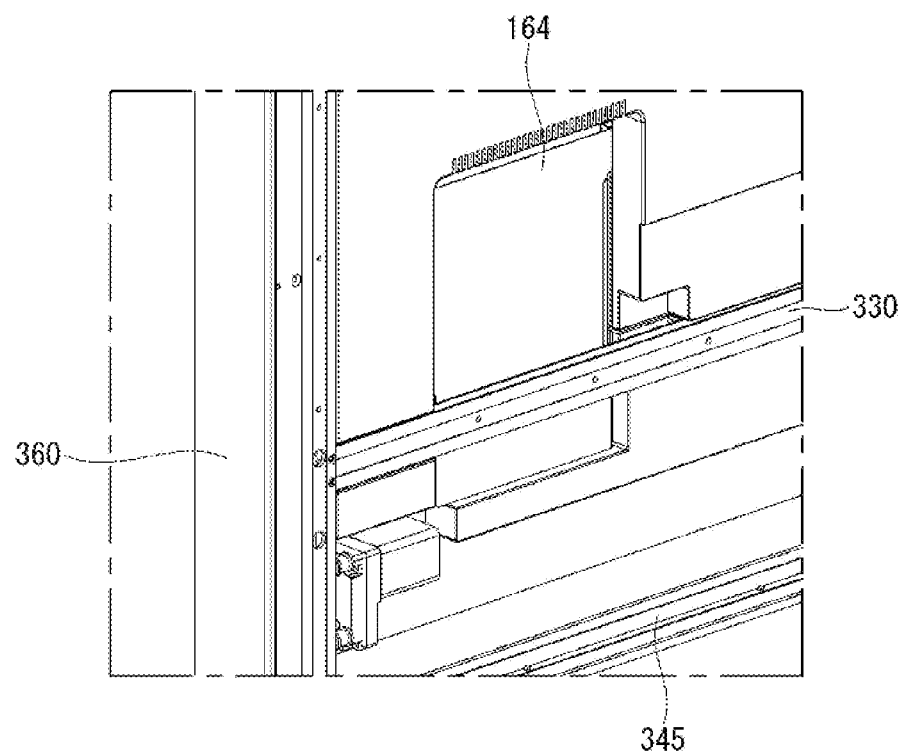

[FIG. 12]
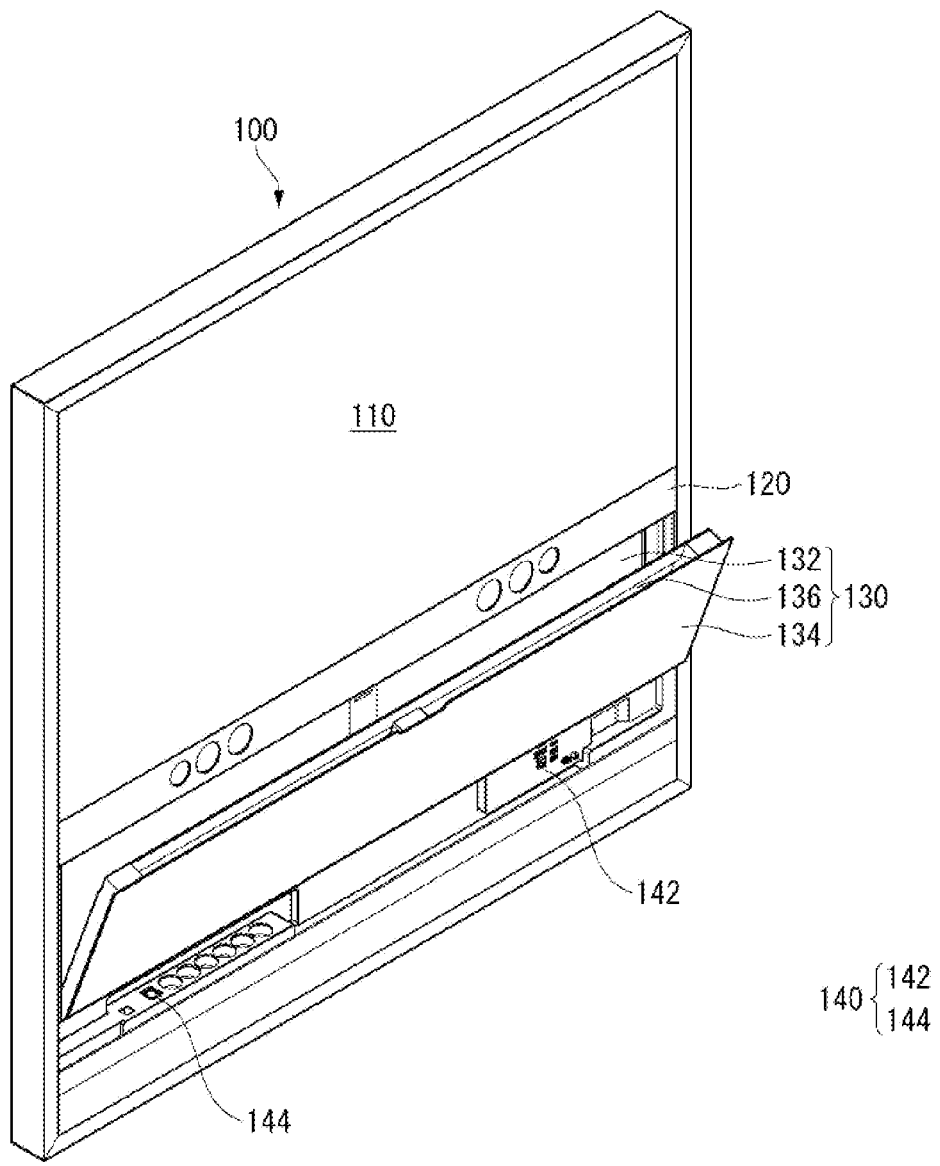

[FIG. 13]
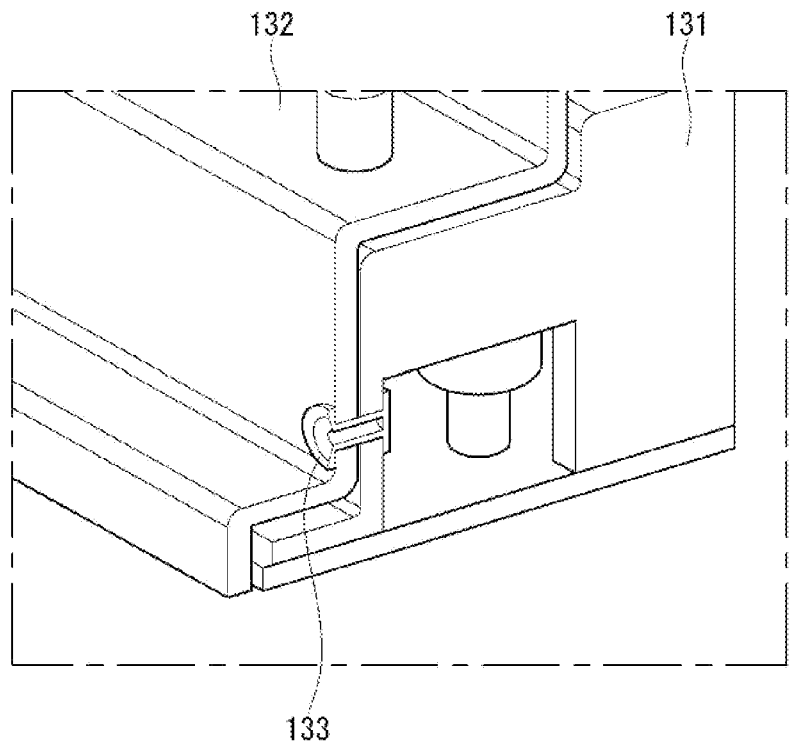
[FIG. 14]
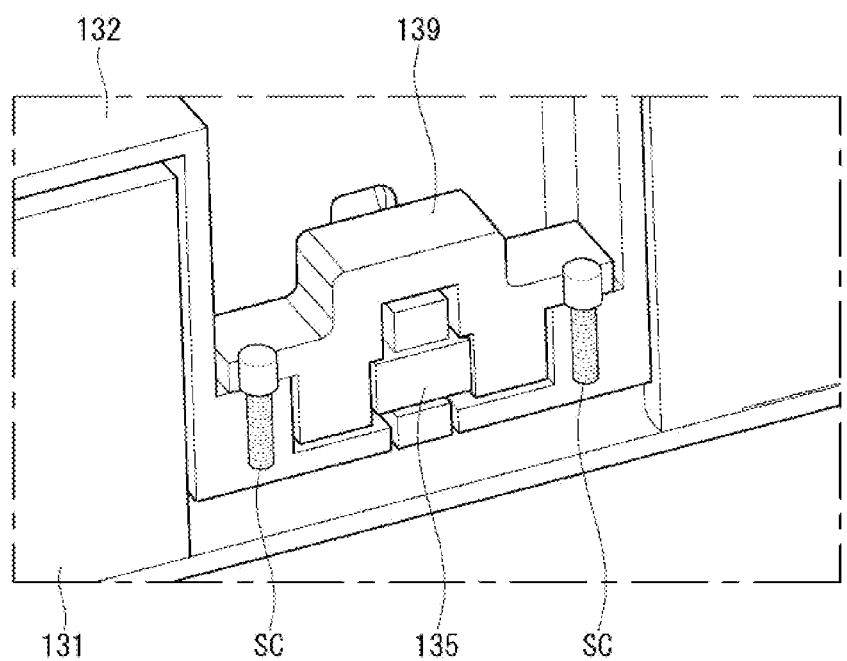

【FIG. 15】
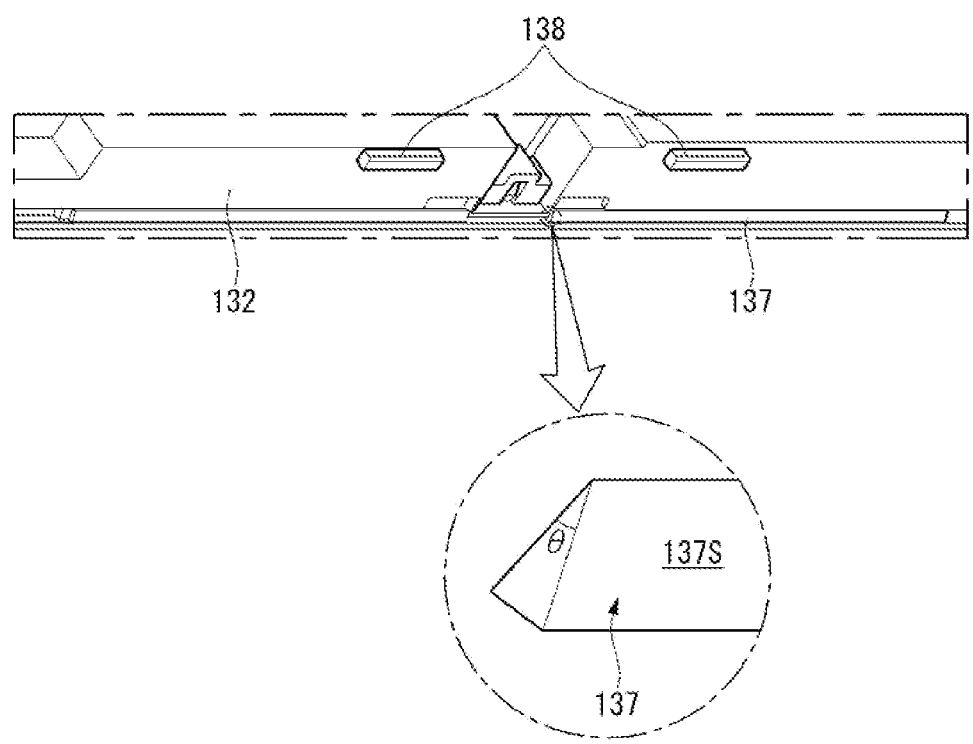

【FIG. 16】
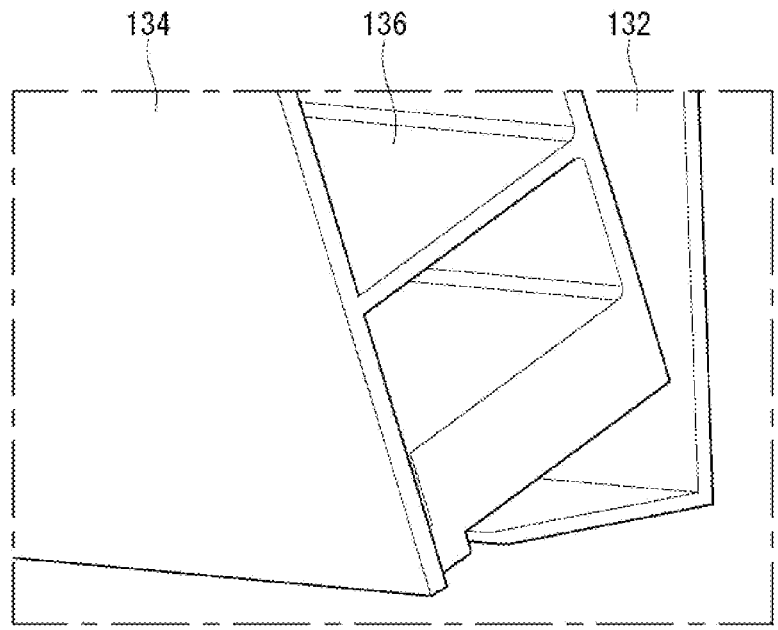
【FIG. 17】
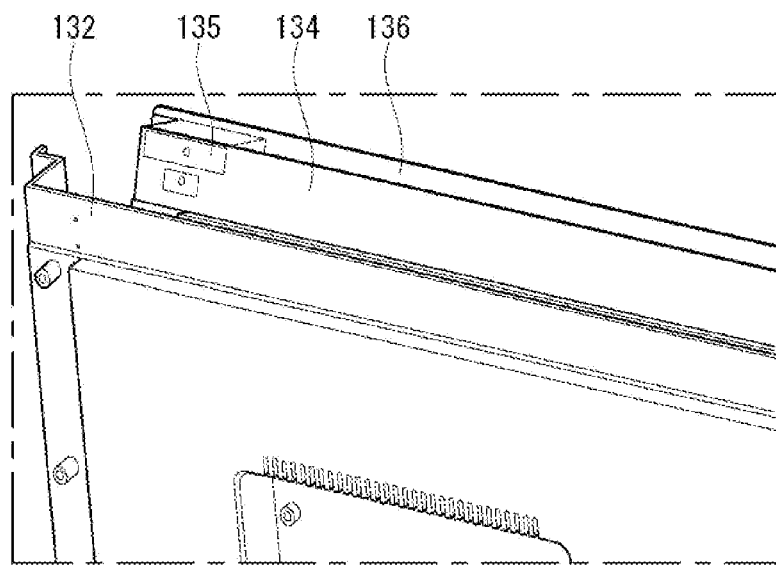

[FIG. 18]
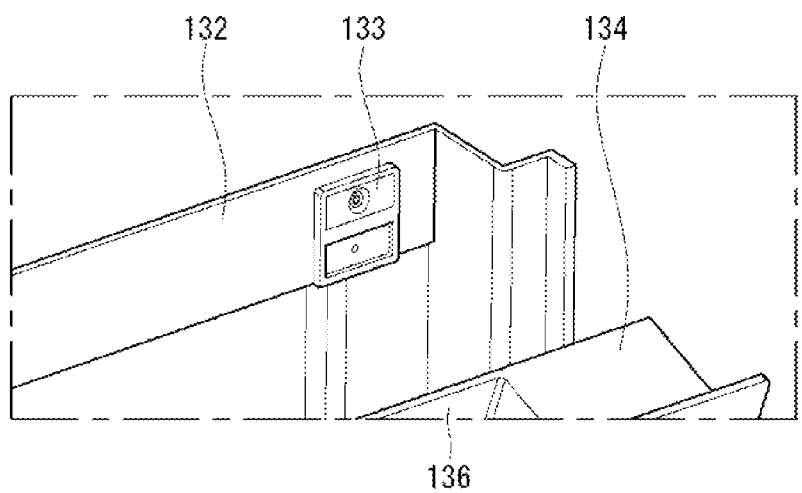

[FIG. 19]
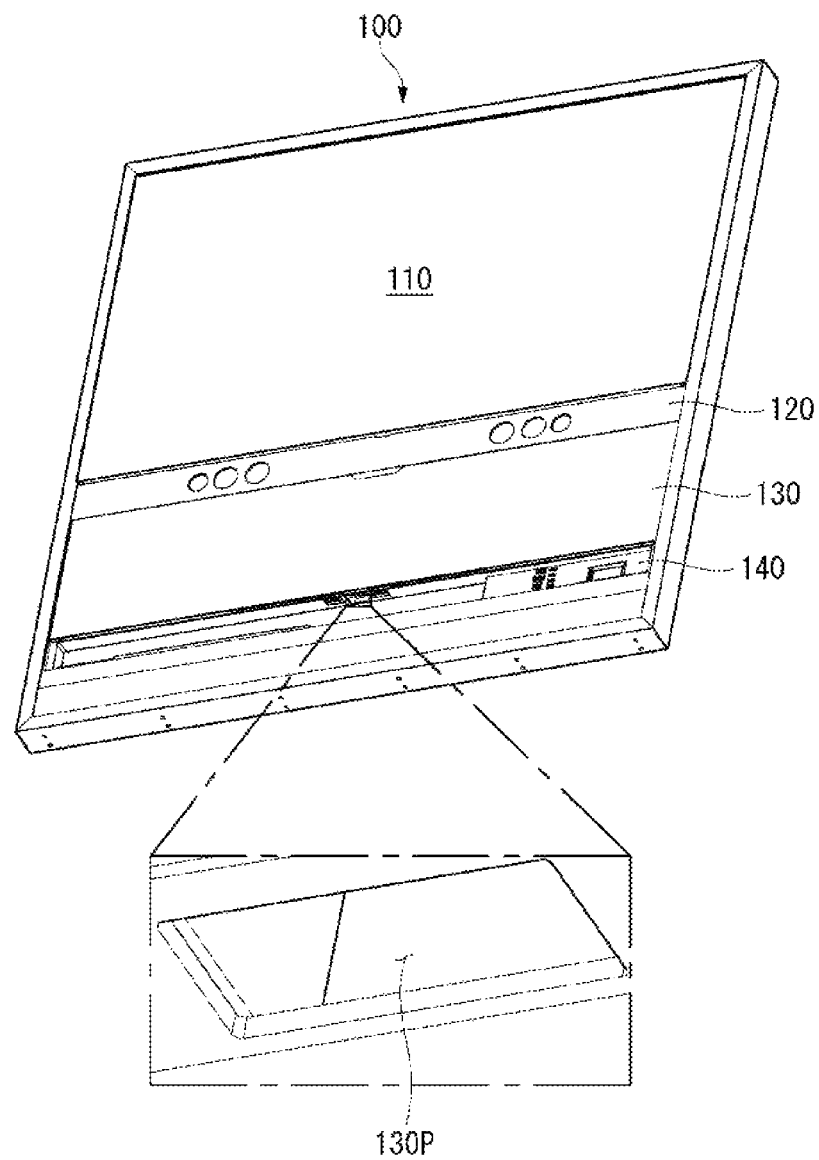

【FIG. 20】
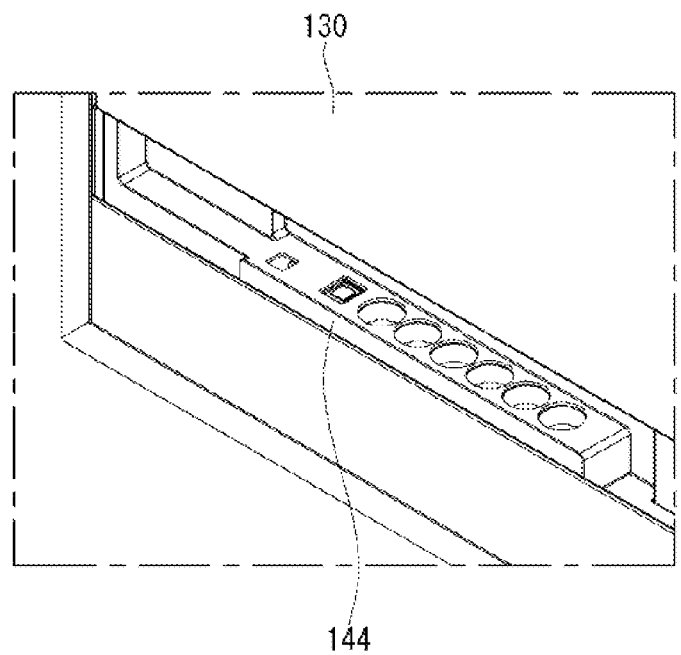
【FIG. 21】
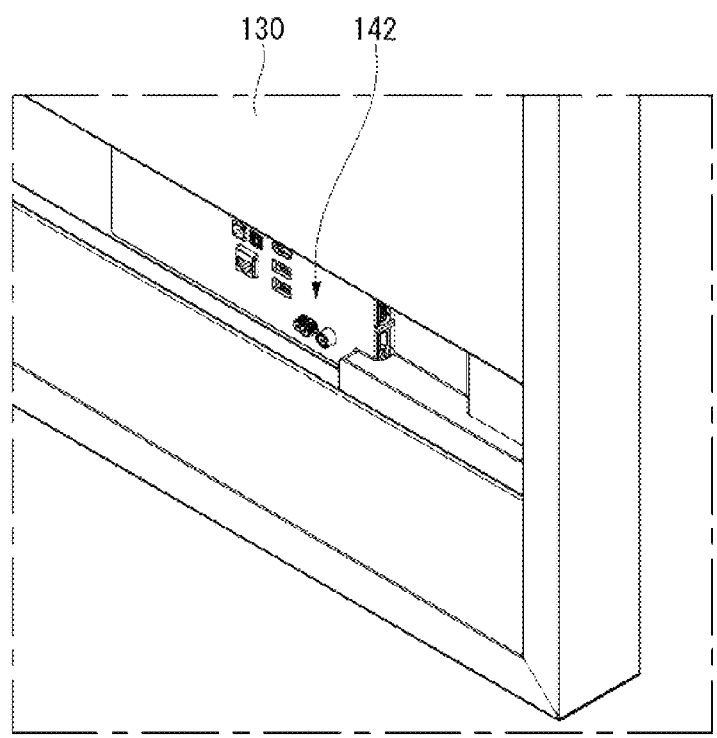

DISPLAY DEVICE

CROSS-REFERENCE TO RELATED APPLICATIONS

This application is the National Stage filing under 35 U.S.C. 371 of International Application No. PCT/KR2019/009389, filed on Jul. 29, 2019, which claims the benefit of earlier filing date and right of priority to Korean Application No. 10-2019-0035907, filed on Mar. 28, 2019, the contents of which are all hereby incorporated by reference herein their entirety.

TECHNICAL FIELD

The present disclosure relates to a display device. More specifically, the present disclosure relates to a storing structure of a display device.

BACKGROUND ART

As the information society develops, the demand for display devices is also increasing in various forms, and in response to this, various display devices such as a liquid crystal display device (LCD), a plasma display panel (PDP), an electroluminescent display (ELD), a vacuum fluorescent display (VFD), and an organic light emitting diode (OLED) have been researched and used.

A liquid crystal panel of the LCD may include a liquid crystal layer, a TFT substrate and a color filter substrate facing each other with a liquid crystal layer therebetween, and display an image using light provided from a backlight unit.

An OLED panel may display an image by depositing an organic material layer that may emit light by itself on a substrate on which a transparent electrode is formed. The OLED panel may be not only thin, but also have flexible characteristics.

Many studies have been conducted on structural characteristics of a display device including such various panels.

DETAILED DESCRIPTION OF INVENTION

Technical Problem

The present disclosure aims to solve the above-mentioned problems and other problems. Another object may be to provide a protective structure for a display panel.

Another object may be to provide a storing structure for a display device.

Technical Solution

According to an aspect of the present disclosure in order to achieve the above or other objects, the present disclosure provides a display panel; a module cover positioned behind the display panel and coupled to the display panel; a frame positioned behind the module cover and coupled to the module cover; a housing positioned below the module cover and fixed to the frame; and a front cover which covers or opens the display panel and the housing while moving in an up-down direction on the frame, wherein the housing includes: a base fixed to an inside of the housing; and a cabinet which pivots with respect to one side of the base and has a storing space.

In addition according to another aspect of the present disclosure, the base may include a stopper formed to protrude from a position where the cabinet is in contact with while performing a pivotal motion, and the stopper may have an inclined surface inclined with respect to a peripheral surface of the stopper.

In addition according to another aspect of the present disclosure, an angle between the peripheral surface and the inclined surface of the stopper may be about 20 degrees.

In addition according to another aspect of the present disclosure, the display device may further include a coupler positioned adjacent to an upper end of the cabinet and coupling the cabinet and the base, wherein the coupler may include a magnet fixed to the cabinet; and a metal member fixed to the base.

In addition according to another aspect of the present disclosure, the module cover may include: a first fixing member positioned adjacent to an upper side of the display panel and formed to protrude from a rear surface of the module cover; and a second fixing member positioned adjacent to a left or right side of the display panel, and formed to protrude from the rear surface of the module cover, wherein the frame may include: a horizontal frame extending to be long in a left-right direction of the display panel; and a vertical frame intersecting with the horizontal frame and coupled to the horizontal frame, wherein the first fixing member may be fixed to the horizontal frame, and the second fixing member may be fixed to the vertical frame.

In addition according to another aspect of the present disclosure, the display device may further include a support member fixed to a rear surface of the horizontal frame or the vertical frame.

In addition according to another aspect of the present disclosure, the display device may further include a connector module positioned under the housing, wherein the connector module may include: terminals disposed on a front surface; and an outlet connected to an external power supply.

In addition according to another aspect of the present disclosure, the display device may further include a power supply mounted on the rear surface of the module cover; and a first controller mounted on a rear surface of the housing, wherein the frame may include: a first horizontal frame adjacent to an upper side of the display panel, positioned behind the module cover, and extending to be long in a left-right direction of the display panel; a second horizontal frame adjacent to a lower side of the display panel, positioned behind the module cover, and extending to be long in the left-right direction of the display panel; and a fourth vertical frame positioned behind the housing, and extending to be long in a left-right direction of the housing, wherein the first controller may be grounded to the fourth vertical frame.

In addition according to another aspect of the present disclosure, the display device may further include a cable electrically connecting the power supply and the outlet, wherein the housing may include an opening formed toward the connector module, and the cable may connect the power supply and the outlet through the opening.

In addition according to another aspect of the present disclosure, the first controller may be positioned adjacent to the terminals.

In addition according to another aspect of the present disclosure, the display device may further include a speaker module positioned between the module cover and the housing, wherein the frame may further include a third horizontal frame positioned between the second horizontal frame and the fourth horizontal frame and extending to be long in a left-right direction of the speaker module, and wherein the vertical frame may be coupled with the first to fourth horizontal frames.

Advantageous Effects

According to at least one embodiment of the present disclosure, it is possible to provide a protective structure for a display panel.

According to at least one embodiment of the present disclosure, it is possible to provide a storing structure for a display device.

Additional scope of applicability of the present disclosure will become apparent from the following detailed description. However, various changes and modifications within the spirit and scope of the present disclosure may be clearly understood by those skilled in the art, and thus, it should be understood that specific embodiments, such as the detailed description and preferred embodiments of the present disclosure, are given only by way of illustration.

DESCRIPTION OF DRAWINGS

FIGS. 1 to 21 are diagrams illustrating examples of a display device according to embodiments of the present disclosure.

MODE FOR INVENTION

Hereinafter, embodiments of the present disclosure will be described in detail with reference to the accompanying drawings, however, the same or similar elements are denoted by the same reference numerals regardless of the reference numerals, and redundant description thereof will be omitted.

The suffixes "module" and "part" for components used in the following description are given or mixed in consideration of ease of specification, and do not have their own meaning or role. Further, in describing the embodiments disclosed in this specification, when it is determined that the detailed description of the related art is likely to blur the gist of the embodiment disclosed in this specification, a detailed description thereof will be omitted. Also, the accompanying drawings are only for the purpose of easily understanding the embodiments disclosed in the present disclosure, and the technical idea disclosed in the present disclosure is not limited by the accompanying drawings, it should be understood that the present disclosure include all modifications, equivalents and substitutes included within the spirit and technical scope of the present disclosure.

The terms first, second, etc. may be used to describe various components, but the components are not limited by such terms. The terms are used only for the purpose of distinguishing one component from other components.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present disclosure, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Referring to FIG. 1, a display device may include a first long side LS1, a second long side LS2 opposite the first long side LS1, a first short side SS1 adjacent to an end of the first long side LS1 and the second long side LS2, and a second short side SS2 opposite the first short side SS1.

Here, it is possible that the first short side area SS1 is referred to as a first side area, the second short side area SS2 is referred to as a second side area opposite the first side area, the first long side area LS1 is referred to as a third side area adjacent to the first side area and the second side area and positioned between the first side area and the second side area, and the second long side area LS2 is referred to as a fourth side area adjacent to the first side area and the second side area and positioned between the first side area and the second side area and opposite the third side area.

In addition, for convenience of description, although lengths of the first and second long sides LS1 and LS2 are longer than lengths of the first and second short sides SS1 and SS2, the lengths of the first and second long sides LS1 and LS2 may be approximately equal to the lengths of the first and second short sides SS1 and SS2.

In addition, hereinafter, a first direction DR1 may be a direction parallel to the long sides LS1 and LS2 of a display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. In addition, the third direction DR3 may be referred to as a vertical direction.

The first long side LS1 may be referred to as an upper side or an upper surface. The second long side LS2 may be referred to as a lower side or a lower surface. The first short side SS1 may be referred to as a left side or a left surface, and the second short side SS2 may be referred to as a right side or a right surface.

In addition, the first long side LS1, the second long side LS2, the first short side SS1, and the second short side SS2 may be referred to as edges of the display device. In addition, a point at which the first long side LS1, the second long side LS2, the first short side SS1, and the second short side SS2 meet each other may be referred to as a corner. For example, a point where the first long side LS1 meets the first short side SS1 may be a first corner C1, a point where the first long side LS1 meets the second short side SS2 may be a second corner C2, a point where the second short side SS2 meets the second long side LS2 may be a third corner C3, and a point where the second long side LS2 meets the first short side SS1 may be a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

A front surface of the display device 100 may be covered. For example, a front cover 200 made of a fabric material may cover the front surface of the display device 100. Accordingly, image information provided by the display device 100 may be covered.

Referring to FIG. 2, the front cover 200 may open a part of the display device 100. A part of the display device 100 may be a part of a display panel 110. The front cover 200 may descend downwardly. Accordingly, a part of an upper part of the display panel 110 may be opened to the outside. In this case, the ratio of the screen may be 48:9. For example, an audio channel may be displayed on a part of an upper surface of the display panel 110.

Referring to FIG. 3, the front cover 200 may open a front surface of the display panel 110 of the display device 100. The front cover 200 may descend downwardly. Accordingly, the front surface of the display panel 110 may be opened to the outside. In this case, the ratio of the screen may be 16:9. For example, an image may be displayed on the front surface of the display panel 110.

Referring to FIG. 4, the front cover 200 may open the front surface of the display device 100. The front cover 200 may descend downwardly adjacent to a lower side of the display device 100. Accordingly, not only the display panel 110, but also a speaker module 120, a housing 130, and a connector module 140 may be opened to the outside of the display device 100. The speaker module 120, the housing 130, and the connector module 140 may be coupled to a frame 300 (see FIGS. 5 and 6).

Referring to FIG. 5, the frame 300 may form a skeleton of the display device 100 (see FIG. 4). The frame 300 may include horizontal frames 310, 320, 330, and 340, and vertical frames 350, 360, 370, and 380. There may be a plurality of horizontal frames 310, 320, 330, 340, and 345. There may be a plurality of vertical frames 350, 360, 370, and 380. The frames 300 may be coupled to each other.

A first horizontal frame 310 may be positioned on an upper side the display device. A second horizontal frame 320 may be parallel to the first horizontal frame 310 and may be positioned below the first horizontal frame 310. A third horizontal frame 330 may be parallel to the second horizontal frame 320 and may be positioned below the second horizontal frame 320. A fourth horizontal frame 340 is parallel to the third horizontal frame 330 and may be positioned below the third horizontal frame 330.

A first vertical frame 350 may be positioned on the left side of the first horizontal frame 310 to the fourth horizontal frame 340, and a second vertical frame 360 may be positioned on the right side of the first horizontal frame 310 to the fourth horizontal frame 340. A third vertical frame 370 and/or a fourth vertical frame 380 may connect the first horizontal frame 310 and the second horizontal frame 320 to each other.

A bar 390 may extend to be long from the first vertical frame 350 to the second vertical frame 360 and move in an up-down direction on front surfaces of the first vertical frame 350 and the second vertical frame 360.

A bottom frame 345 may form a lower surface of the display device. The frames 300 may be coupled on the bottom frame 345.

Referring to FIGS. 6 to 9, a display module 110 and 150 may be coupled to the frame 300. The display module 110 and 150 may include the display panel 110 and a module cover 150 to which the display panel 110 is fixed. The module cover 150 may be fixed to the frame 300. The module cover 150 may be fixed to the horizontal frames 310, 320, 330, and 340 and/or the vertical frames 350, 360, 370, and 380.

A fixing member 151 may be mounted or fixed to a rear surface of the module cover 150. For example, the fixing member 151 may be a pem nut. The fixing member 151 may extend to be long rearward from the module cover 150 to reach the frame 300. The fixing member 151 may fix the module cover 150 to the frame 300. There may be a plurality of fixing members 151.

The first fixing member 151 may be positioned adjacent to an upper side of the module cover 150. The first fixing member 151 may be coupled to the first horizontal frame 310. For example, the first fixing member 151 may be bolted to the first horizontal frame 310. Although not shown, there may be a plurality of the first fixing member 151, and the plurality of first fixing members 151 may be disposed along a length direction of the first horizontal frame 310.

A second fixing member 152 may be positioned adjacent to the right side and/or the left side of the module cover 150. The second fixing member 152 may be coupled to the second vertical frame 360 and/or the first vertical frame 350. For example, the second fixing member 152 may be bolted to the second vertical frame 360 and/or the first vertical frame 350.

Accordingly, the display module 110 and 150 may be firmly fixed to the frame 300.

A support member 153 may be coupled to a rear surface of the frame 300. There may be a plurality of support members 153. For example, the support member 153 may be a synthetic resin having elasticity, and may be coupled to a rear surface of the third vertical frame 370 and/or the fourth vertical frame 380. Accordingly, it is possible to absorb an impact generated from the rear of the display device. Alternatively, the display device may be supported on a structure such as a wall.

Referring to FIGS. 10 and 11, the housing 130 may be positioned below the display module 110 and 150. The housing 130 may be positioned in front of the frame 300. A control module 160 may be installed on a rear surface of the display module 110 and 150 and/or a rear surface of the housing 130.

The control module 160 may include a power supply 162, a first controller 164, and a second controller 166. The power supply 162 may be positioned between the module cover 150 and the third vertical frame 370. The power supply 162 may be fixed to the rear surface of the module cover 150. The first controller 164 may be positioned between the housing 130 and the fourth vertical frame 380. The first controller 164 may be fixed to the rear surface of the housing 130 and may be contact with the fourth vertical frame 380. For example, the first controller 164 may be a main PCB. The second controller 166 may be fixed to the rear surface of the module cover 150. For example, the second controller 166 may be a T-con board.

The speaker module 120 may be positioned between the module cover 150 and the housing 130. The speaker module 120 may be coupled to the module cover 150 and/or the housing 130.

The first controller 164 may process high-capacity image information, and may be positioned on the rear surface of the housing 130 to correspond to terminals 142 (refer to FIG. 4) of the connector module 140 input to the first controller 164. In this case, the first controller 164 may be contact with the fourth vertical frame 380 to be electrically grounded. For example, the contact between the first controller 164 and the fourth vertical frame 380 may be made through a screw.

The power supply 162 may be electrically connected to the first controller 164. The speaker module 120 and the first controller 164 may be electrically connected. The first controller 164 and the second controller 166 may be electrically connected. An outlet 144 of the connector module 140 and the power supply 162 may be electrically connected.

Referring to FIGS. 12 and 13, the housing 130 may include a base 132 and a cabinet 134. The housing 130 is positioned between the sound module 120 and the connector module 140 and may be coupled to the sound module 120 and/or the connector module 140. The housing 130 may have, for example, an overall rectangular shape. The base 132 may be fixed to an inside of the housing 130. For example, the left side and/or the right side of the base 132 may be fixed to the inside 131 of the housing 130 by a washer 133 and/or a screw 133.

Referring to FIGS. 12 and 14, a supporter 139 may be positioned in the center of the base 132 and may fix the base 132 to the housing 130. The supporter 139 may be coupled to a pin 135 fixed to the inside 131 of the housing 130. The supporter 139 may fix the base 132 to the housing 130 on an upper side of the pin 135. The supporter 139 may be fixed to the base 131 by, for example, a screw SC, and the supporter 139 and the pin 135 may be fixed to each other.

Referring to FIGS. 12, 15 and 16, the cabinet 134 may pivot with respect to the base 132. The cabinet 134 may rotate with respect to a lower end of the base 131. The cabinet 134 may include a storing space 136. For example, a set-top box, an Internet module, a modem, and the like may be accommodated in the storing space 136 of the cabinet 134. The base 132 may have a stopper 137. The stopper 137 may protrude from the base 132 toward the cabinet 134. The stopper 137 may limit the pivoting angle of the cabinet 134. The stopper 137 may have an inclined surface 137S inclined at a certain angle (Θ). For example, the certain angle (Θ) may be 20 degrees. The certain angle (Θ) may be an angle formed between a peripheral surface of the stopper 137 and the inclined surface 137S.

Referring to FIGS. 12, 17 and 18, a coupler may include a magnet 135 and a metal member 133. The coupler may couple the base 132 and the cabinet 134. For example, the magnet 135 may be fixed to the cabinet 134 and the metal member 133 may be fixed to the base 132. For another example (not shown), the magnet 135 may be fixed to the base 132, and the metal member 133 may be fixed to the cabinet 134.

For example, there may be a plurality of magnets 135, the magnets 135 may be disposed on the upper left and right sides of the cabinet 134, respectively, and the metal member 133 may correspond to the magnet 135. That is, the metal member 133 may be a plurality of pieces corresponding to the plurality of magnets 135, and may be disposed on the upper left and right sides of the base 132, respectively.

Accordingly, the housing 130 and/or the base 132 may hold the cabinet 134 while the cabinet 134 pivots with respect to the base 132.

Referring to FIGS. 19 to 21, the housing 130 may have an opening 130P. The opening 130P may be formed on a lower surface of the housing 130. The opening 130P may connect and penetrate between the housing 130 and the connector module 140. Power required by the display module 110 and 150 may be provided while a power cable CD electrically connects the display module 110 and 150 and the outlet 144 through the opening 130P. For example, the power cable CD of the display module 110 and 150 may be inserted into the outlet 144 (see FIG. 10). For example, the outlet 144 may be a multi-tap.

The terminals 142 may be disposed on a front surface of the connector module 140. The terminals 142 may be exposed to the outside of the connector module 140. The terminals 142 may be, for example, a USB terminal, an HDMI terminal, an airwave terminal, a LAN terminal, or the like. The terminals 142 may be electrically connected to the first controller 164 (see FIG. 10).

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claims is:
1. A display device comprising:
a display panel;
a module cover positioned behind the display panel and coupled to the display panel;
a frame positioned behind the module cover and coupled to the module cover;
a housing positioned below the module cover and fixed to the frame; and
a front cover which covers or opens the display panel and the housing while moving in an up-down direction on the frame,
wherein the housing includes:
a base fixed to an inside of the housing; and
a cabinet which pivots with respect to one side of the base and has a storing space,
wherein the base includes a stopper formed to protrude from a position where the cabinet is in contact with while performing a pivotal motion, and
the stopper has an inclined surface inclined with respect to a peripheral surface of the stopper.
2. The display device of claim 1, wherein an angle between the peripheral surface and the inclined surface of the stopper is about 20 degrees.
3. The display device of claim 2, further comprising:
a coupler positioned adjacent to an upper end of the cabinet and coupling the cabinet and the base,
wherein the coupler includes:
a magnet fixed to the cabinet; and
a metal member fixed to the base.
4. The display device of claim 1, wherein the module cover includes:
a first fixing member positioned adjacent to an upper side of the display panel and formed to protrude from a rear surface of the module cover; and
a second fixing member positioned adjacent to a left or right side of the display panel, and formed to protrude from the rear surface of the module cover,
wherein the frame includes:
a horizontal frame extending to be long in a left-right direction of the display panel; and
a vertical frame intersecting with the horizontal frame and coupled to the horizontal frame, wherein the first fixing member is fixed to the horizontal frame, and the second fixing member is fixed to the vertical frame.

5. The display device of claim 4, further comprising:

a support member fixed to a rear surface of the horizontal frame or the vertical frame.

6. The display device of claim 1, further comprising:

a connector module positioned under the housing, wherein the connector module includes:

terminals disposed on a front surface; and an outlet connected to an external power supply.

7. The display device of claim 6, further comprising:

a power supply mounted on the rear surface of the module cover; and a first controller mounted on a rear surface of the housing, wherein the frame includes:

a first horizontal frame adjacent to an upper side of the display panel, positioned behind the module cover, and extending to be long in a left-right direction of the display panel;

a second horizontal frame adjacent to a lower side of the display panel, positioned behind the module cover, and extending to be long in the left-right direction of the display panel; and a fourth vertical frame positioned behind the housing, and extending to be long in a left-right direction of the housing, wherein the first controller is grounded to the fourth vertical frame.

8. The display device of claim 7, further comprising:

a cable electrically connecting the power supply and the outlet, wherein the housing includes an opening formed toward the connector module, and the cable connects the power supply and the outlet through the opening.

9. The display device of claim 7, wherein the first controller is positioned adjacent to the terminals.

10. The display device of claim 7, further comprising:

a speaker module positioned between the module cover and the housing, wherein the frame further includes a third horizontal frame positioned between the second horizontal frame and the fourth horizontal frame and extending to be long in a left-right direction of the speaker module, and wherein the vertical frame is coupled with the first to fourth horizontal frames.

* * * * *